US012660645B2

(12) United States Patent
Jaffar et al.

(10) Patent No.: US 12,660,645 B2
(45) Date of Patent: Jun. 16, 2026

(54) MOLDED INTERCONNECT MEMORY ON PACKAGE

(71) Applicant: Intel Corporation, Santa Clara, CA (US)

(72) Inventors: Hazwani Jaffar, Kepala Batas (MY); Poh Boon Khoo, Perai (MY); Hooi San Lam, Air Itam (MY); Jiun Hann Sir, Gelugor (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 17/741,988

(22) Filed: May 11, 2022

(65) Prior Publication Data

US 2023/0369232 A1     Nov. 16, 2023

(51) Int. Cl.
| | |
|---|---|
| *H01L 25/18* | (2023.01) |
| *H10W 70/05* | (2026.01) |
| *H10W 70/60* | (2026.01) |
| *H10W 90/00* | (2026.01) |
| *H10W 70/63* | (2026.01) |

(52) U.S. Cl.
CPC ........ *H10W 70/611* (2026.01); *H10W 70/093* (2026.01); *H10W 90/00* (2026.01); *H10W 90/401* (2026.01); *H10W 70/635* (2026.01); *H10W 90/701* (2026.01)

(58) Field of Classification Search
CPC .. H01L 23/5385; H01L 21/4853; H01L 25/18
See application file for complete search history.

(56) References Cited

U.S. PATENT DOCUMENTS

| | | | | |
|---|---|---|---|---|
| 8,779,606 | B2 * | 7/2014 | Yim | H10W 72/072 |
| | | | | 257/777 |
| 10,163,865 | B2 * | 12/2018 | Chen | H10W 90/00 |
| 11,462,461 | B2 * | 10/2022 | Zhang | H10W 90/701 |
| 2020/0312755 | A1 * | 10/2020 | Choi | H10W 70/635 |
| 2023/0130436 | A1 * | 4/2023 | Kim | H10W 90/701 |
| | | | | 257/668 |
| 2023/0387078 | A1 * | 11/2023 | Chang | H10W 72/20 |
| 2024/0213164 | A1 * | 6/2024 | Liu | H10W 70/65 |
| 2025/0105194 | A1 * | 3/2025 | Lee | H10W 90/00 |
| 2025/0140773 | A1 * | 5/2025 | Lee | H10W 74/01 |

* cited by examiner

*Primary Examiner* — Thao P Le

(74) *Attorney, Agent, or Firm* — Essential Patents Group, LLP

(57) ABSTRACT

An electronic system includes a first substrate including first solder bumps on a bottom surface, the first solder bumps having a first solder bump surface opposite from the bottom surface; a processor integrated circuit (IC) die including at least one processor mounted on a top surface of the first substrate; and a companion component to the processor IC. The companion component includes a second substrate, second solder bumps, and third solder bumps. The second solder bumps include a second solder bump surface, and the third solder bumps include a third solder bump surface at a different height than the second solder bump surface. The second solder bump surface contacts the top surface of the first substrate and the third solder bump surface is at a same height as the first solder bump surface.

21 Claims, 9 Drawing Sheets

⊘ DDR CHANNEL 1 BGA
⊘ DDR CHANNEL 2 BGA
⊗ DDR VCC BGA

DDR CHANNEL 1

DDR CHANNEL 2

204

204

110

102

406

426

428

408

600

CHANNEL 0/1 ROUTING
CHANNEL 2/3 ROUTING
DDR POWER

604

604

102     632     604

634

636     638     636

600

604     102     632     604

MOLDED INTERCONNECT MEMORY ON PACKAGE

TECHNICAL FIELD

Embodiments pertain to packaging of integrated circuits (ICs). Some embodiments relate to IC package interconnection of integrated circuits.

BACKGROUND

Electronic systems often include integrated circuits (ICs) that are connected to a subassembly such as a substrate or mother board. As electronic system designs become more complex, it is a challenge to route the desired interconnection of the ICs of the systems. This can lead to a larger form factor for the system. Thus, there are general needs for devices, systems and methods that address the area challenges for electronic systems.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In a memory-down approach for packaging of double data rate random access memory (DDR RAM), ball grid array (BGA) solder balls are placed at the bottom of the package. The memory components are placed on the mother board next to another device (e.g., a processor). The signals from the DDR RAM travel down into another component (a printed circuit board (PCB) or mother board) and then routed to the other device. This leads to a significant increase in package form factor (FF) to accommodate all the DDR RAM solder balls and to route interconnect from the solder balls to one or more other devices. In addition, signal routings for the DDR RAM can be relatively long, resulting in signal integrity trade off (due to the lossy board routing). Described herein are techniques to package DDR RAM or another companion device to the processor with reduced FF.

Figure 1A:
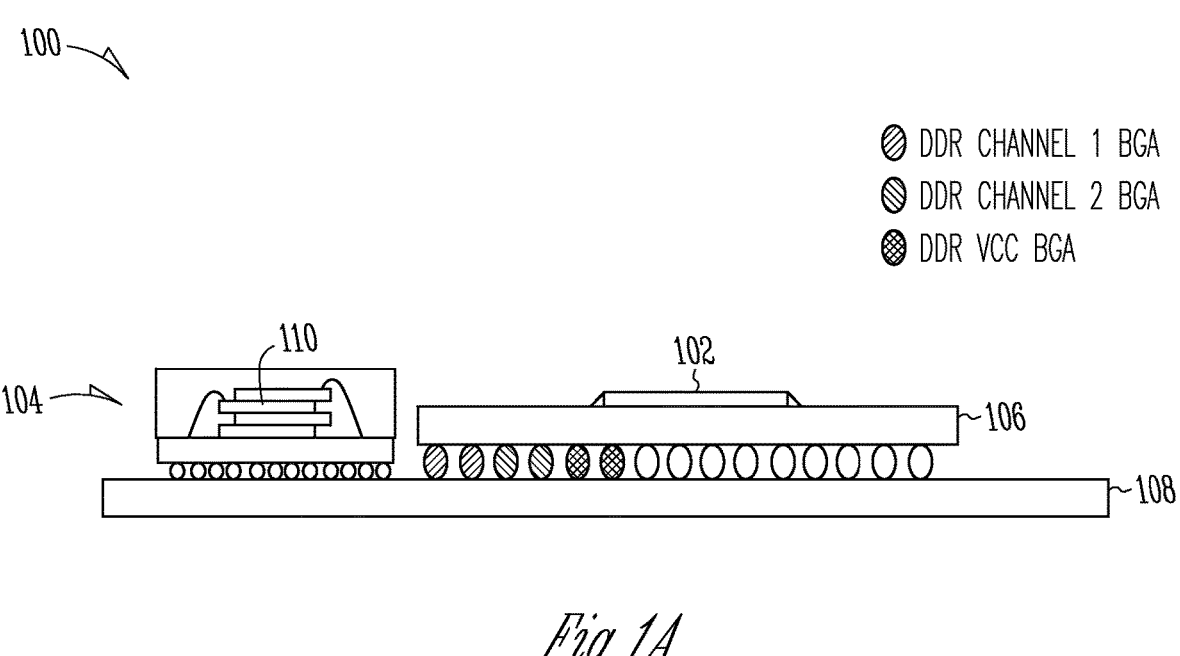
FIGS. 1A and 1B are an example of an electronic system in accordance with some example embodiments.
Figure 1B:
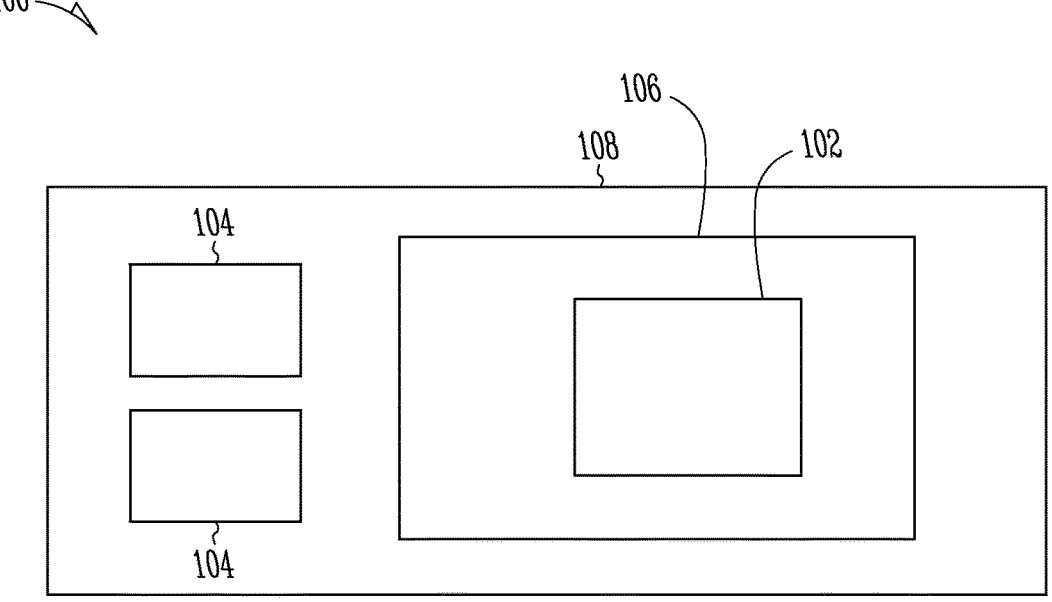

FIGS. 1A and 1B are an example of an electronic system 100 that uses a memory down type of approach to packaging DDR RAM as a memory on package (MOP) component. FIG. 1A shows a side view of the electronic system 100. The electronic system 100 includes an integrated circuit (IC) die 102 and a MOP component 104. The IC die 102 is a processor IC die that can include one or more processors and is mounted on an electronics package substrate 106. The package substrate 106 is mounted on a mother board 108 or other PCB. The MOP component 104 can include multiple memory dies 110 stacked in a pre-molded system on chip (SoC) package to save area. In the memory-down design, the DDR RAM signals are routed down into the mother board 108. The mother board 108 provides the DDR RAM signals and power to the package substrate 106 and the processor IC die 102. FIG. 1B is a top view of the electronic system 100 of FIG. 1A. The MOP components 104 are mounted in the mother board 108 next to the package substrate 106 with the IC die 102.

Figure 2A:
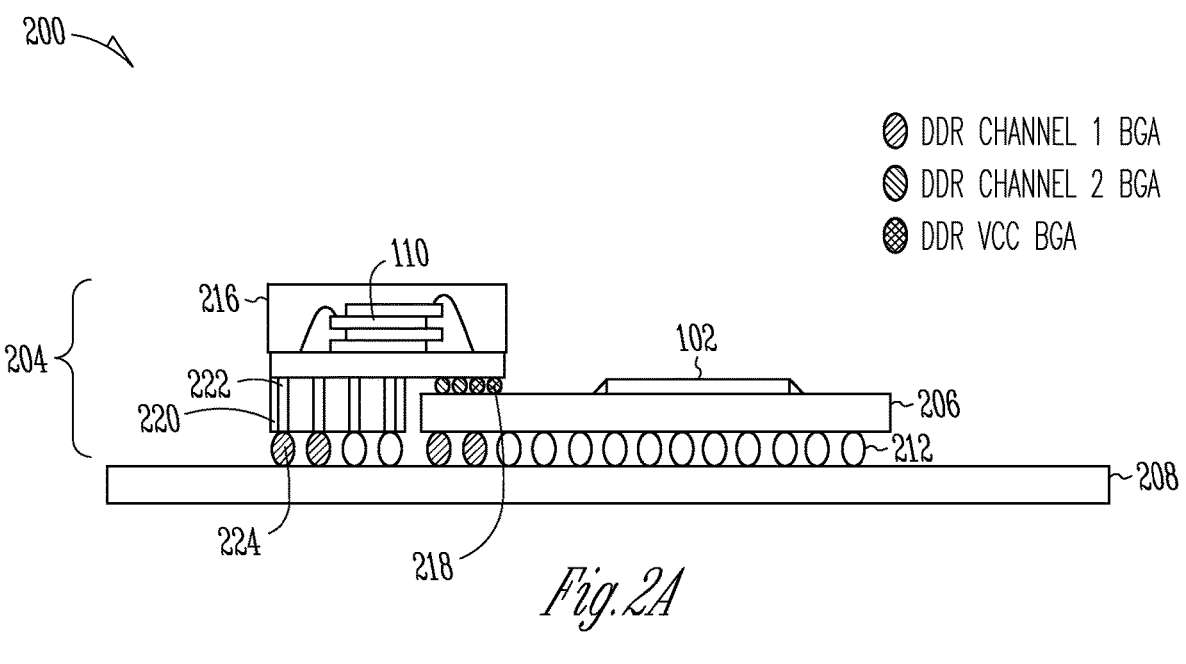
FIGS. 2A and 2B are another example of an electronic system in accordance with some example embodiments.
Figure 2B:
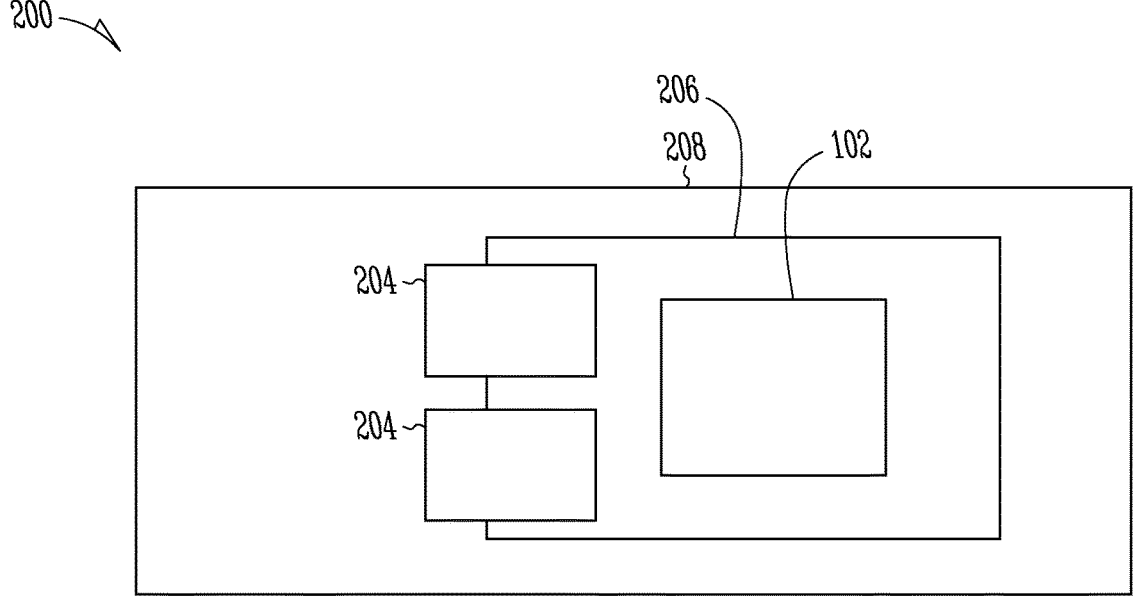

FIGS. 2A and 2B are another example of an electronic system 200 with an improved approach to packaging over the approach in FIGS. 1A and 1B. The electronic system 200 of FIG. 2A includes a processor IC die 102 and a companion component to the processor IC die 102. The processor IC die 102 is mounted on an electronics package substrate 206. The package substrate 206 includes bonding pads on the bottom surface of the package substrate 206, and the package substrate 206 is bonded to the mother board 208 by solder bumps 212. The package substrate 206 also includes bonding pads on the top surface of the package substrate 206 and interconnect that routes signals from the bonding pads to the processor IC die 102.

The companion component can include, among other things, one or more memory ICs, a field programmable gate array (FPGA), or an input-output (I/O) controller. In the example of FIG. 2A, the companion component is a MOP component 204 that includes memory dies 110 that can include one or more DDR RAM dies. The memory dies 110 are arranged on a substrate 214 that can be covered by a mold layer 216. The substrate 214 can be made from a ceramic material or an organic material. The substrate 214 includes a first set of BGA bonding pads that are connected to the top surface of the package substrate 206 by solder bumps 218.

The MOP component 204 includes a mold interconnect 220 that contacts the substrate 214 and includes one or more through mold vias (TMVs) 222. The TMVs 222 may be metal pillars (e.g., copper pillars) covered by the mold or may be openings formed in the mold and then filled with metal. The mold interconnect 220 includes a second set of bonding pads that contact the TMVs 222. The second set of bonding pads are connected to the mother board 208 by solder bumps 224.

The solder bumps 224 that connect the MOP component 204 to the mother board 208 and the solder bumps 212 that connect the package substrate 206 to the mother board 208 are approximately the same size and have a solder bump surface at substantially the same height that is bonded to the mother board 208. The bonding pads of the MOP component 204 for solder bumps 224 and the bonding pads of the package substrate 206 for solder bumps 212 may have the same pitch feature size. The solder bumps 218 that connect the MOP component 204 to the top surface of the package substrate 206 are smaller in size than solder bumps 224 and solder bumps 212. The bonding pads of the MOP component 204 for solder bumps 218 and the bonding pads on the top surface of the electronics package substrate 206 for solder bumps 218 have a smaller feature pitch size than the bonding pads for solder bumps 224 and solder bumps 212.

FIG. 2B is a top view of the electronic system 200 showing the position of the MOP components 204 relative to the packaged IC die. A comparison of FIGS. 1B and 2B shows the reduction on FF of the electronic system 200 of FIG. 2B compared to the electronic system 100 of FIG. 1B. Because the MOP component 204 is partially mounted on the package IC die, the MOP components 204 and package substrate 206 overlap, and the FF of the electronic system 200 in FIG. 2B is reduced.

As described regarding FIG. 2A, the DDR RAM signals are transferred between the memory dies 110 and the processor IC die 102 through the connection of the solder bumps 218 between the substrate 214 and package substrate 206. Power and ground can be provided to the memory dies 110 from the mother board 208 using the connection of solder bumps 224. Because the DDR signals do not enter the mother board 208 before entering the IC die 102 as in FIG. 1A, the routing of the DDR RAM signals is shorter in FIG. 2A, resulting in improved memory performance.

Figure 3:
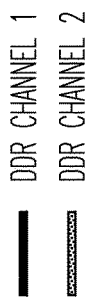
FIG. 3 is a side view of the example electronic system of FIGS. 1A and 1B in accordance with some example embodiments.
Figure 3:
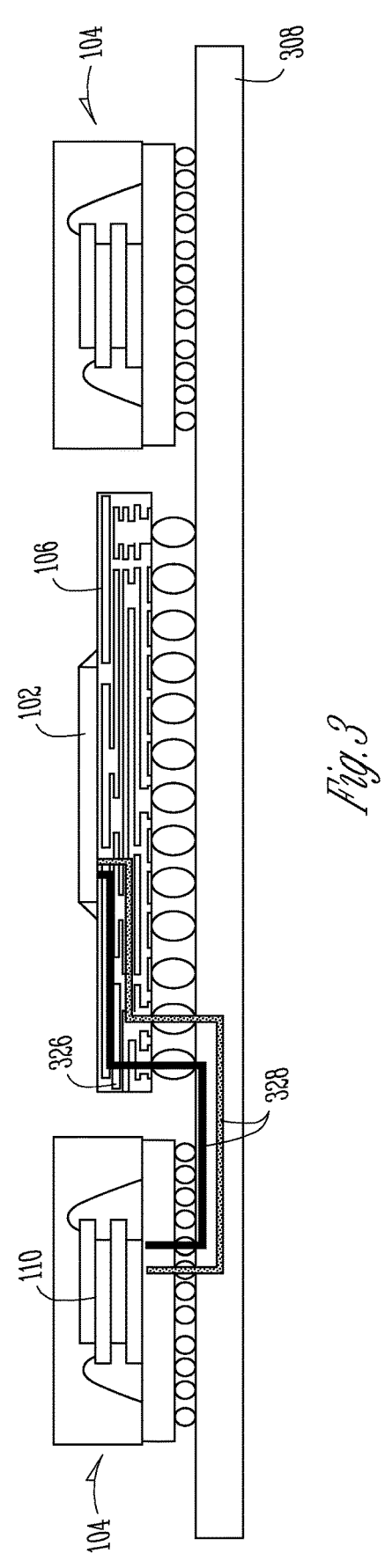

FIG. 3 is a side view of an example of the packaging approach of the example of FIGS. 1A and 1B. The example includes two MOP components 104 mounted next to a packaged IC die 102 on mother board 108. The electrically conductive interconnect 326 of the package substrate 106 is shown. Also shown is the interconnect path 328 that carries DDR RAM signals from the memory dies 110 to the mother board 108 to the package substrate, and finally to the IC die 102.

Figure 4:
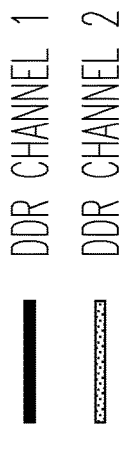
FIG. 4 is a side view of the example electronic system of FIGS. 2A and 2B in accordance with some example embodiments.

FIG. 4 is a side view of an example of the packaging approach of the example of FIGS. 2A and 2B. The example includes two MOP components 204 and a packaged IC die 102. Both MOP components 204 include connections to the top surface of the package substrate 406. The electrically conductive interconnect 426 of the package substrate 406 is shown. Also shown is the interconnect path 428 that carries DDR RAM signals from the memory dies 110 to the IC die 102. The interconnect path 428 that carries DDR RAM signals in FIG. 4 does not go through the mother board 408 and the interconnect path 428 of the FIG. 4 is much shorter than the interconnect path 328 of FIG. 3, and the performance of the memory access by the IC die 102 is improved over the example in FIG. 3.

Figure 5:
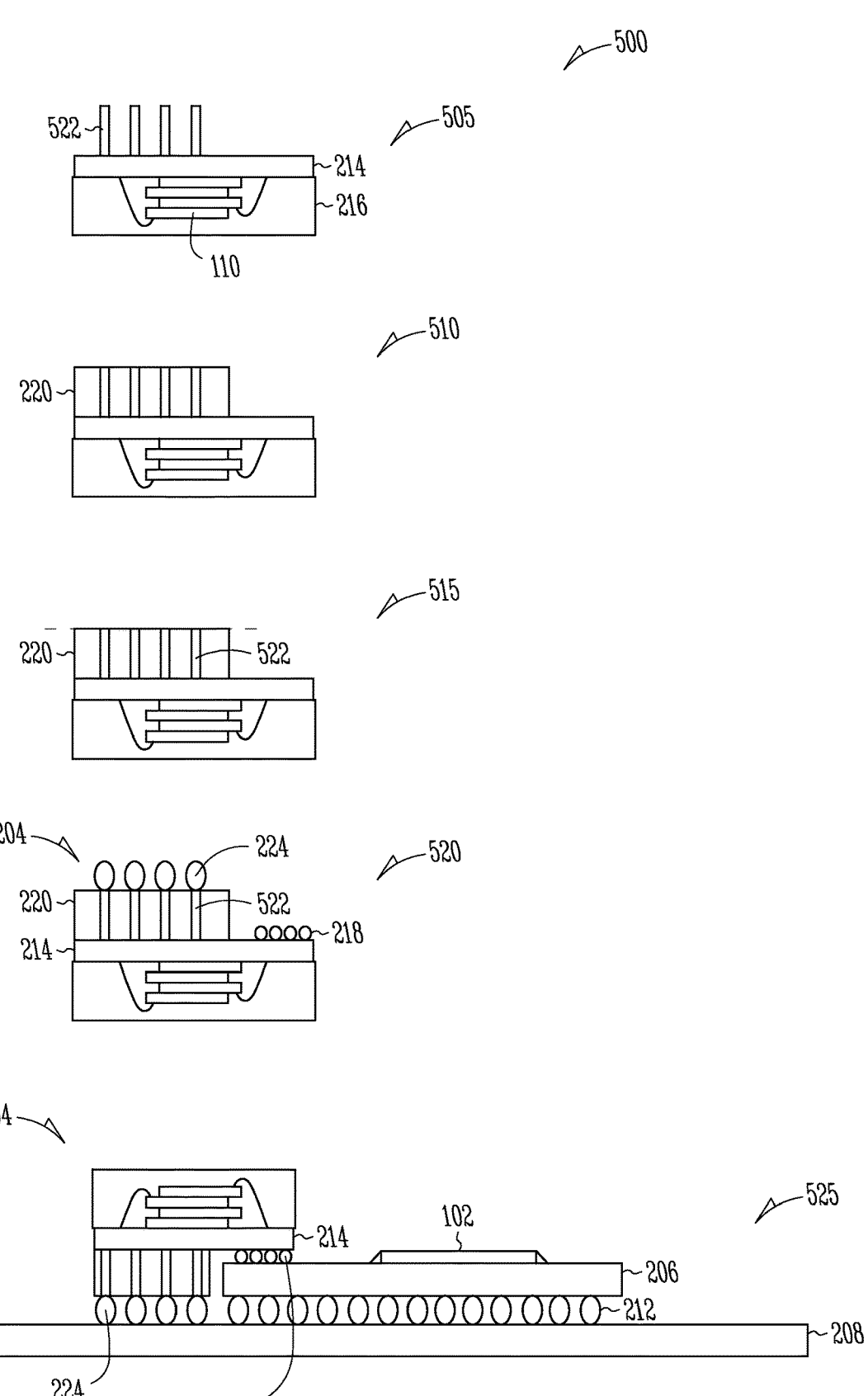
FIG. 5 is a flow diagram of an example of a method of manufacturing an electronic system in accordance with some embodiments.

FIG. 5 is a flow diagram of an example of a method 500 of manufacturing an electronic device and including the electronic device in an electronic system. The electronic device is a companion component for a processor of a processor IC die. In the example of FIG. 5, the companion component is a MOP component (e.g., the MOP component 204 of FIG. 2A). The process flow starts with stacking one or more memory dies 110 on a substrate 214 and forming a mold layer 216 over the memory dies 110.

At stage 505, a lead frame is attached to the substrate 214. The lead frame includes conductive pillars 522 that can be metal (e.g., copper or aluminum). At stage 510, selective molding is applied over the lead frame to form a mold interconnect 220. The molding is selective because the mold is applied to only a portion of the substrate 214. Bonding pads can be formed in the exposed portion of the substrate 214. At stage 515, the surface of the mold interconnect 220 is ground to expose the ends of the pillars 522 and smooth the surface of the mold interconnect 220.

At stage 520, solder bumps are formed on the mold interconnect 220 and the substrate 214 to complete the MOP component 204. Some of the solder bumps 218 are formed on the substrate 214 and some of the solder bumps 224 are formed on the mold interconnect 220 to contact the exposed ends of the pillars 522. Solder bumps 224 are larger than solder bumps 218. Bonding wires and conductive interconnect of the substrate can provide electrically continuity between the solder bumps 218 and the memory dies 110. Bonding pads may be formed on the mold interconnect 220 to contact the second portion of the solder bumps 224. The bonding pads on the mold interconnect 220 and the exposed portion of the substrate 214 may be BGA bonding pads. The bonding pads for solder bumps 218 may have a smaller feature pitch size than the bonding pads for solder bumps 224.

At stage 525, a processor IC die 102 is attached to a top surface of a package substrate 206. More solder bumps 212 are formed on the bottom surface of the package substrate 206. The solder bumps 212 may be the same size as solder bumps 224. The package substrate 206 is attached to the mother board 208. The MOP component 204 is attached (e.g., using a surface mount technology reflow process) to both the top surface of the package substrate 206 and to the mother board 208. Solder bumps 224 may be the same height as solder bumps 212, and solder bumps 218 may be smaller than both solder bumps 224 and solder bumps 212.

With the memory I/O BGA pad arranged on the top of the package substrate 206, the number of BGA balls at the bottom surface of the package substrate 206 can be significantly reduced. This leads to a smaller package form factor. Memory performance is also improved because the overall memory signal routing length is reduced as compared to the memory down approach of FIG. 3. Area on the mother board 208 is reduced due to the memory channels being routed directly between the package substrate 206 and the memory dies 110 without going through mother board routing and the MOP component is placed on the package substrate 206 instead of on the mother board 208.

Figure 6A:
FIGS. 6A and 6B are another example of an electronic system in accordance with some example embodiments.
Figure 6A:
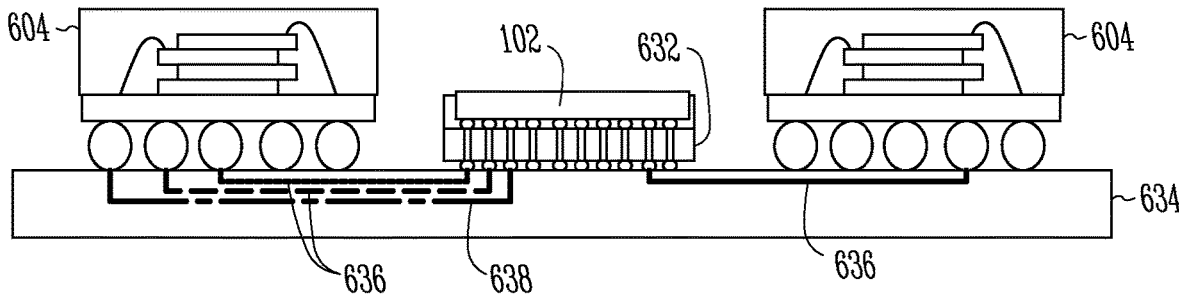
Figure 6B:
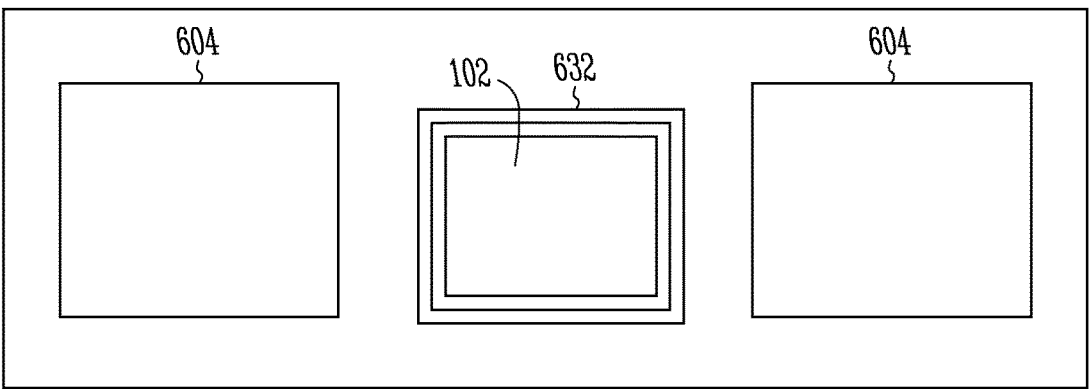

FIGS. 6A and 6B are another example of an electronic system 600 that uses a memory down approach to packaging DDR RAM. In FIG. 6A, the electronic system 600 includes an integrated circuit (IC) die 102 and two MOP components 604. The IC die 102 may be a processor IC die that can include one or more processors, and the IC die 102 is mounted on a mold interconnect substrate 632. The mold interconnect substrate 632 with the IC die 102 is mounted on an electronics package substrate 634. The MOP components 604 are also mounted on the package substrate 634. FIG. 6A shows the memory down design of the routing 636 of the DDR RAM signal channels and power 638 for the DDR RAM. FIG. 6B is a top view showing the FF of the electronic system 600.

Figure 7A:
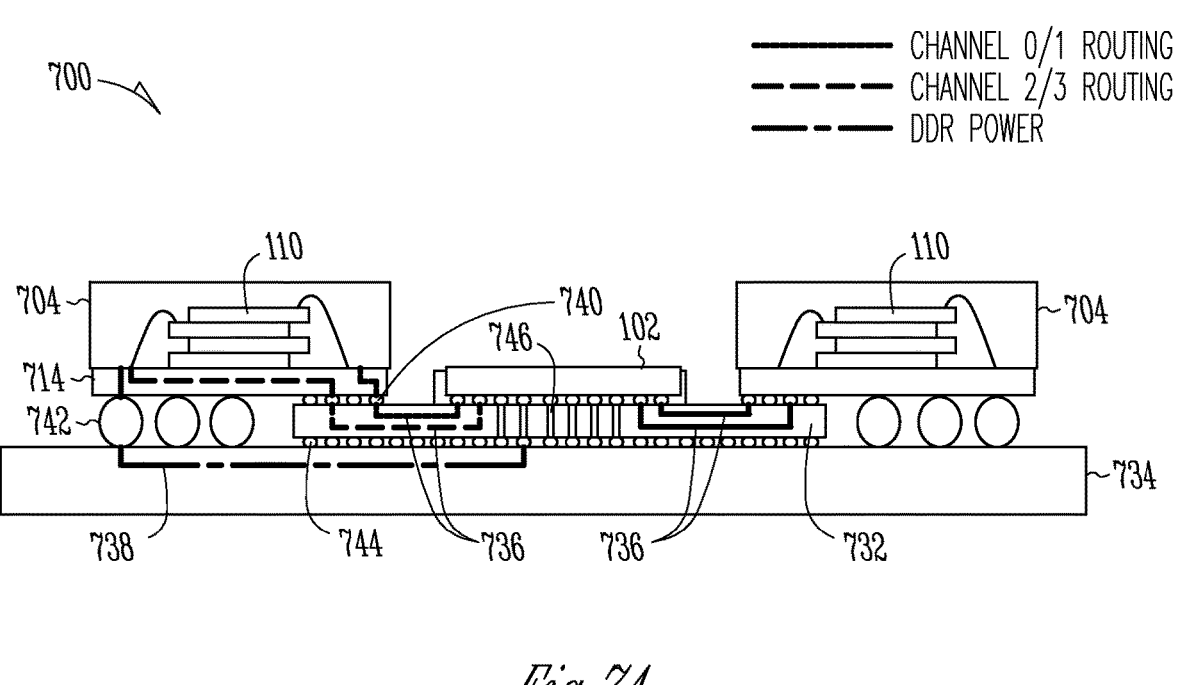
FIGS. 7A and 7B are another example of an electronic system in accordance with some example embodiments.
Figure 7B:
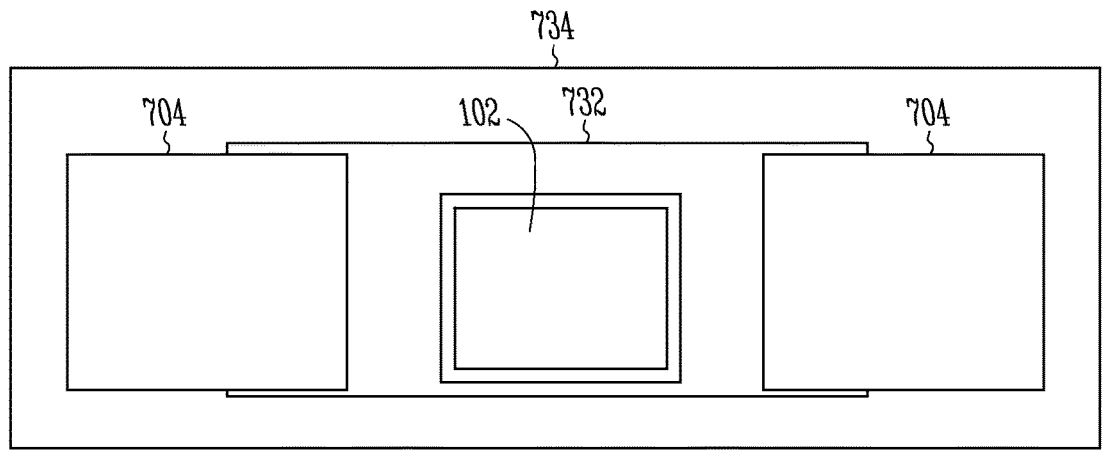

FIGS. 7A and 7B are an example of an electronics system 700 with improved packaging over the memory down approach of FIGS. 6A and 6B. In FIG. 7A, the electronic system 700 includes an integrated circuit (IC) die 102 and two MOP components 704. The IC die 102 is mounted on a mold interconnect substrate 732 that is in turn mounted on a package substrate 734. The mold interconnect substrate 732 includes electrically conductive interconnect between the IC die 102 and bonding pads on the top surface of the mold interconnect substrate 732.

The MOP components 704 include solder bumps. Some of the solder bumps 740 contact the top surface of the mold interconnect substrate 732. The other solder bumps 742 contact the package substrate 734. Solder bumps 742 are larger than solder bumps 740. The height of solder bumps 742 match the height of the combination of solder bumps 740, the mold interconnect substrate 732, and solder bumps 744 on the bottom surface of the mold interconnect substrate 732. The bottom surface of solder bumps 742 is at the same level as the bottom surface of solder bumps 744. The substrate 714 of the MOP component 704 can include BGA bonding pads for solder bumps 742 and 744, and the bonding pads for solder bumps 742 have a larger feature pitch size than the bonding pads for solder bumps 740.

The mold interconnect substrate 732 includes electrically conductive interconnect 736 that provides electrical continuity between the memory dies and the IC die 102. The mold interconnect substrate 732 also includes TMVs 746. The package substrate 734 includes electrically conductive interconnect 738 that provides electrical continuity between solder bumps 742 and the TMVs 746. The routing for the power of the MOP components 704 goes through the package substrate 734, but the routing between the memory dies 110 and the IC die 102 goes through the top of the mold interconnect substrate 732 and does not go through the package substrate 734. The result is a shorter routing of memory signals compared to the memory down approach of FIGS. 6A and 6B, FIG. 7B is a top view of the electronic system showing the FF of the electronic system 600. Because the MOP components 704 are mounted on the top of the mold interconnect substrate 732 and the memory signals are not routed through the package substrate 734, the MOP components 704 can be placed closer to the IC die 102 than in the example of FIGS. 6A and 6B. This reduces the FF of the electronic system 700 on the package substrate 734. Memory performance is improved over the example in FIGS. 6A and 6B because the length of the routing for memory signals is shortened. Routing the memory signals through the mold interconnect substrate 732 also has the advantage of reducing the layer count of the package substrate 734. This simplifies the package substrate 734. This may offset the increase in interconnect of the mold interconnect substrate 732 from the mold interconnect substrate 632 of FIGS. 6A and 6B.

Figure 8:
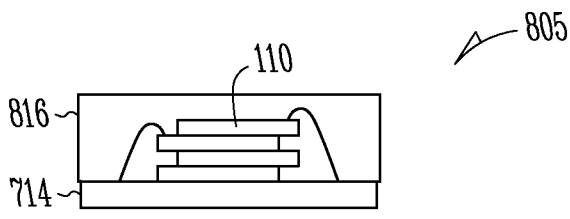
FIG. 8 is a flow diagram of an example of a method of manufacturing an electronic system in accordance with some example embodiments.
Figure 8:
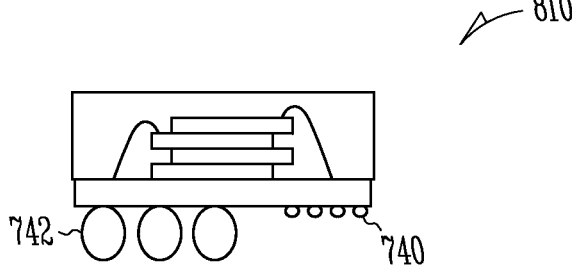
Figure 8:
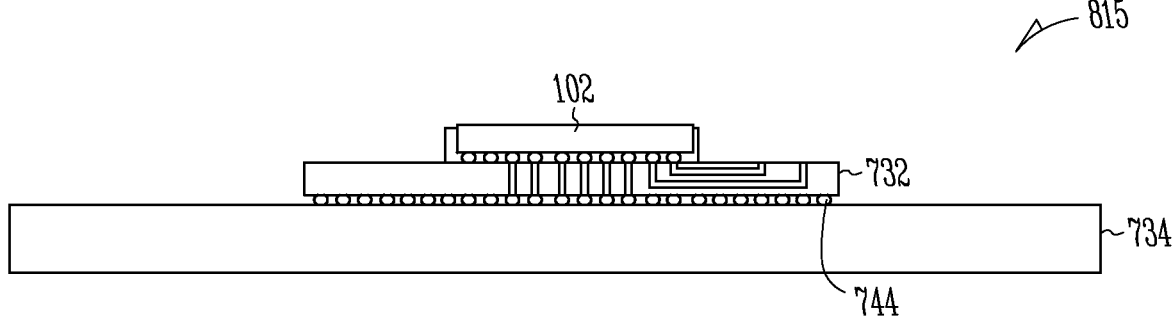
Figure 8:
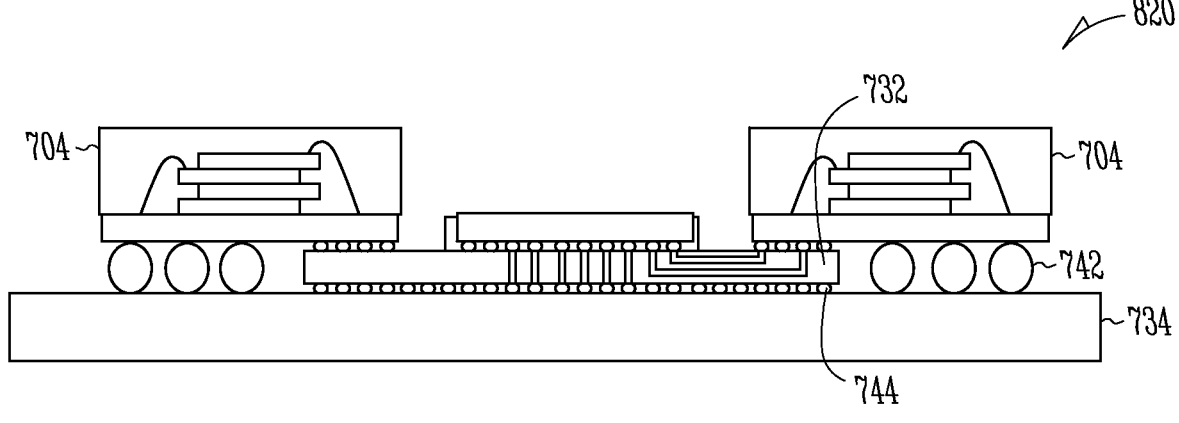

FIG. 8 is a flow diagram of an example of a method of manufacturing a companion component for a processor IC die and including the companion component and IC die in an electronic device. The companion component includes a companion circuit for the processor of the IC die. In the example of FIG. 8, the companion component is a MOP component (e.g., the MOP component 704 of FIG. 7A). The process flow starts at stage 805 with stacking one or more memory dies 110 on a substrate 214 and forming a mold layer 216 over the memory dies 110.

At stage 810, solder bumps are attached to the substrate 714. The solder bumps have two sizes (e.g., standard solder ball and micro solder ball sizes). The substrate 714 may include two sets of BGA bonding pads for each of the two sets of solder bumps. Solder bumps 742 may be configured to carry memory signals and solder bumps 742 may be configured to carry power and ground.

At stage 815, the IC die 102 is attached to a mold interconnect substrate 732 (e.g., using a thermo-compression bonding (TCB) process) and the mold interconnect substrate 732 is attached to the package substrate 734.

At stage 820, the MOP components 704 are attached to the mold interconnect substrate 732 and the package substrate 734. The height of solder bumps 742 of the MOP components 704 may match the height of the mold interconnect substrate 732 and solder bumps 744 so that the bottom bonding surfaces of solder bumps 742 and 744 are at the same level.

The techniques described herein for packaging of electronic devices reduces the form factor of packaged electronic systems and can improve performance of the packaged devices. An example of an electronic system using assemblies with system level packaging as described in the present disclosure is included to show an example of a higher level device application.

Figure 9:
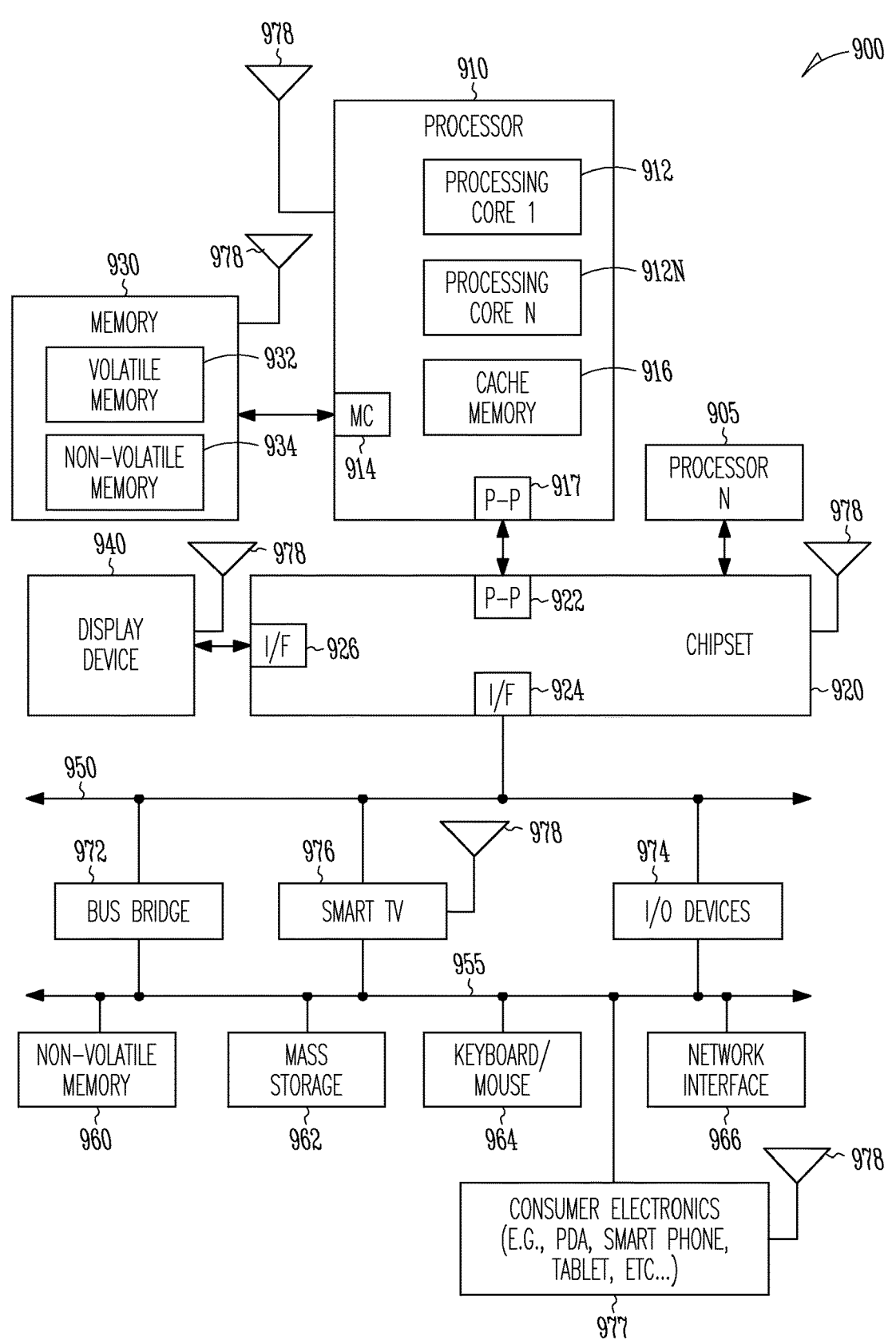
FIG. 9 shows an electronic system that may incorporate molded interconnect on package and methods in accordance with some example embodiments.

FIG. 9 illustrates a system level diagram, according to one embodiment of the invention. For instance, FIG. 9 depicts an example of an electronic device (e.g., system) that can include an IC die mounted on a substrate and a companion component partially mounted on the same substrate and partially mounted on another substrate or PCB. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system. In one example, two or more systems as shown in FIG. 9 may be coupled together using the system level packaging techniques as described in the present disclosure.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. The memory 930 may be included in a MOP component of the system. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the invention, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface (I/F) 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In one addition, chipset 920 connects to one or more buses 950 and 955 that interconnect various system elements such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

The devices, systems, and methods described can provide improved routing of interconnection between ICs for a multichip package in addition to providing improved transistor density in the IC die. Examples described herein include two or three IC dies for simplicity, but one skilled in the art would recognize upon reading this description that the examples can include more than three IC dies.

To better illustrate the method and apparatuses disclosed herein, a non-limiting list of embodiments is provided here:

Example 1 includes subject matter (such as an electronic system) comprising a first substrate including first solder bumps on a bottom surface, the first solder bumps having a first solder bump surface opposite from the bottom surface, a processor integrated circuit (IC) die including at least one processor mounted on a top surface of the first substrate, and a companion component. The companion component includes a second substrate, second solder bumps including a second solder bump surface, and third solder bumps including a third solder bump surface at a different height than the second solder bump surface. The second solder bump surface contacts the top surface of the first substrate and the third solder bump surface is at a same height as the first solder bump surface.

In Example 2, the subject matter of Example 1 optionally includes a mother board, and the first substrate is an electronics package substrate. The first solder bump surface of the first substrate and the third solder bump surface of the companion component contact the mother board.

In Example 3, the subject matter of one or both of Examples 1 and 2 optionally include a companion component that includes a molded interconnect. The molded interconnect includes a first molded surface that contacts the second substrate and a second molded surface at a same height as the bottom surface of the first substrate.

In Example 4, the subject matter of Example 3 optionally includes a molded interconnect that includes through mold vias (TMVs). The second solder bump surface of the companion component contacts the second substrate, and the third solder bump surface of the companion component contacts the TMVs.

In Example 5, the subject matter of one or any combination of Examples 1-4 optionally includes a companion component that is a memory on package (MOP) component that includes double data rate random access memory (DDR RAM). The second solder bumps are configured to carry DDR signals to the first substrate and the third solder bumps are configured to carry power to the DDR RAM.

In Example 6, the subject matter of one or any combination of Examples 1-5 optionally includes an electronics package substrate, and the first substrate is a molded interconnect substrate. The first solder bump surface of the first substrate and the third solder bump surface of the companion component contact the electronics package substrate.

In Example 7, the subject matter of Example 6 optionally includes a molded interconnect substrate that includes electrically conductive interconnect that provides electrical continuity between the second solder bumps of the companion component and the processor IC die and one or more one or more through mold vias (TMVs). The electronics package substrate includes electrically conductive interconnect that provides electrical continuity between the second solder bumps of the companion component and the one or more TMVs.

In Example 8, the subject matter of one or any combination of Examples 1-7 optionally includes a feature pitch size of bonding pads for the second solder bumps of the companion component being smaller than a feature pitch size of bonding pads for the third solder bumps of the companion component.

In Example 9, the subject matter of one or any combination of Examples 1-8 optionally includes a companion component that is a memory on package (MOP) component. The first substrate includes electrically conductive interconnect that provides electrical continuity between the second solder bumps of the MOP component and the processor IC die.

Example 10 includes subject matter (such as a method of forming an electronic device) or can optionally be combined with one or any combination of Examples 1-9 to include such subject matter, comprising attaching a processor integrated circuit (IC) die to a top surface of a first substrate, forming first solder bumps on a bottom surface of the first substrate, the first solder bumps having a first solder bump surface opposite from the bottom surface, attaching a companion circuit of the processor to a first surface of a second substrate, forming a mold layer over the companion circuit to form a first side of a companion component to the processor IC die, forming second solder bumps on a second side of the companion component, the second solder bumps having a second solder bump surface, forming third solder bumps on the second side of the companion component, the third solder bumps having a third solder bump surface at a different height than the second solder bump surface, and attaching the second solder bumps to the top surface of the first substrate so that the third solder bump surface is at a same height as the first solder bump surface.

In Example 11, the subject matter of Example 10 optionally includes attaching a lead frame to a portion of the second surface of the second substrate, forming a second mold layer on the portion of the second surface of the second substrate that includes the lead frame, exposing ends of the lead frame at a surface of the second mold layer, and forming the third solder bumps to contact the ends of the lead frame at the surface of the second mold layer.

In Example 12, the subject matter of one or both of Example 10 and 11 optionally includes forming the first solder bumps on a bottom surface of a first substrate that is an electronics package substrate, and attaching the first solder bumps of the electronics package substrate and the third solder bumps of the companion component to a mother board.

In Example 13, the subject matter of one or both of Example 10 and 11 optionally includes forming the first solder bumps on a bottom surface of a first substrate that is a molded interconnect substrate, and attaching the first solder bumps of the molded interconnect substrate and the third solder bumps of companion component to an electronics package substrate.

In Example 14, the subject matter of one or any combination of Examples 10-13 optionally includes forming the third solder bumps larger than the second solder bumps of the companion component.

Example 15 includes subject matter (such as an electronic system) or can optionally be combined with one or any combination of Examples 1-14 to include such subject matter, comprising a first substrate including first solder bumps on a bottom surface, a processor integrated circuit (IC) die including at least one processor mounted on a top surface of the first substrate, and a memory on package (MOP) component. The MOP component includes a second substrate, one or more double data rate random access memory (DDR RAM) dies on a first surface of the second substrate, second solder bumps contacting a second surface of the second substrate and a top surface of the first substrate, a molded interconnect disposed on the second surface of the second substrate, the molded interconnect including through mold vias (TMVs), and third solder bumps contacting the TMVs on a surface of the molded interconnect.

In Example 16, the subject matter of Example 15 optionally includes a mother board. The first substrate is an electronics package substrate, and the first solder bumps of the first substrate and the third solder bumps of the MOP component contact the mother board.

In Example 17, the subject matter of Example 16 optionally includes the second solder bumps configured to provide DDR signals to the electronics package substrate and the third solder bumps are configured to provide power from the mother board to the DDR RAM.

In Example 18, the subject matter of one or any combination of Examples 15-17 optionally includes bonding pads for the first solder bumps and bonding pads for the third solder bumps of the MOP component that have a same feature pitch size, and bonding pads for the second solder bumps of the MOP component have a smaller feature pitch size than the bonding pads for the third solder bumps of the MOP component.

Example 19 includes subject matter (such as an electronic system) or can optionally be combined with one or any combination of Examples 1-18 to include such subject matter, comprising a first substrate including first solder bumps on a bottom surface of the first substrate, the first solder bumps having a solder bump surface opposite the bottom surface of the first substrate, a processor integrated circuit (IC) die including at least one processor mounted on a top surface of the first substrate, and a memory on package (MOP) component. The MOP component includes a second substrate, one or more double data rate random access memory (DDR RAM) dies on a first surface of the second substrate, second solder bumps that contact a second surface of the second substrate and the top surface of the first substrate, and third solder bumps that contact a second surface of the second substrate, the third solder bumps having a solder bump surface at a same height as the solder bump surface of the first solder bumps.

In Example 20, the subject matter of Example 19 optionally includes an electronics package substrate. The first solder bumps of the first substrate and the third solder bumps of the MOP component contact the electronics package substrate.

In Example 21, the subject matter of one or both of Examples 19 and 20 optionally includes a molded interconnect that includes electrically conductive interconnect that provides electrical continuity between the second solder bumps of the MOP component and the processor IC die, and one or more through mold vias (TMVs). The electronics package substrate includes electrically conductive interconnect that provides electrical continuity between the third solder bumps of the MOP component and the one or more TMVs of the molded interconnect.

These non-limiting example embodiments can be combined in any permutation or combination. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. An electronic system, comprising
a first substrate comprising first solder bumps on a bottom surface, the first solder bumps having a first solder bump surface opposite from the bottom surface;

a processor integrated circuit (IC) die comprising at least one processor mounted on a top surface of the first substrate; and
a companion component comprising:
a second substrate;
second solder bumps comprising a second solder bump surface;
third solder bumps comprising a third solder bump surface at a different height than the second solder bump surface, wherein the second solder bump surface contacts the top surface of the first substrate and the third solder bump surface is at a same height as the first solder bump surface; and
a molded interconnect comprising a first molded surface that contacts the second substrate and a second molded surface at a same height as the bottom surface of the first substrate.

2. The electronic system of claim 1, comprising a mother board, wherein the first substrate is an electronics package substrate, and the first solder bump surface of the first substrate and the third solder bump surface of the companion component contact the mother board.

3. The electronic system of claim 1, wherein the molded interconnect comprises through mold vias (TMVs), the second solder bump surface of the companion component contacts the second substrate, and the third solder bump surface of the companion component contacts the TMVs.

4. The electronic system of claim 1, wherein the companion component is a memory on package (MOP) component comprising double data rate random access memory (DDR RAM), the second solder bumps are configured to carry DDR RAM signals to the first substrate, and the third solder bumps are configured to carry power to the DDR RAM.

5. The electronic system of claim 1, comprising an electronics package substrate, wherein the first substrate is a molded interconnect substrate, and the first solder bump surface of the first substrate and the third solder bump surface of the companion component contact the electronics package substrate.

6. The electronic system of claim 5, wherein the molded interconnect substrate comprises:
a first electrically conductive interconnect that provides electrical continuity between one or more of the second solder bumps of the companion component and the processor IC die; and
one or more through mold vias (TMVs), wherein the electronics package substrate comprises a second electrically conductive interconnect that provides electrical continuity between one or more of the second solder bumps of the companion component and the one or more TMVs.

7. The electronic system of claim 1, wherein a feature pitch size of bonding pads for the second solder bumps of the companion component is smaller than a feature pitch size of bonding pads for the third solder bumps of the companion component.

8. The electronic system of claim 1, wherein the companion component is a memory on package (MOP) component and the first substrate comprises an electrically conductive interconnect that provides electrical continuity between the second solder bumps of the MOP component and the processor IC die.

9. A method of forming an electronic device, comprising:
attaching a processor integrated circuit (IC) die to a top surface of a first substrate;

forming first solder bumps on a bottom surface of the first substrate, the first solder bumps having a first solder bump surface opposite from the bottom surface;

attaching a companion circuit of the processor IC die to a first surface of a second substrate;

forming a mold layer over the companion circuit to form a first side of a companion component to the processor IC die;

attaching a lead frame to a portion of a second surface of the second substrate;

forming a second mold layer on the portion of the second surface of the second substrate comprising the lead frame;

exposing ends of the lead frame at a surface of the second mold layer;

forming second solder bumps on a second side of the companion component, the second solder bumps having a second solder bump surface;

forming third solder bumps on the second side of the companion component, the third solder bumps having a third solder bump surface at a different height than the second solder bump surface, wherein forming the third solder bumps comprises forming the third solder bumps to contact the ends of the lead frame at the surface of the second mold layer; and attaching the second solder bumps to the top surface of the first substrate so that the third solder bump surface is at a same height as the first solder bump surface.

10. The method of claim 9, wherein the first substrate is an electronics package substrate, forming the first solder bumps comprises forming the first solder bumps on a bottom surface of the electronics package substrate, and the method further comprises attaching the first solder bumps of the electronics package substrate and the third solder bumps of the companion component to a mother board.

11. The method of claim 9, wherein the first substrate is a molded interconnect substrate, forming the first solder bumps comprises forming the first solder bumps on a bottom surface of the molded interconnect substrate, and the method further comprises attaching the first solder bumps of the molded interconnect substrate and the third solder bumps of companion component to an electronics package substrate.

12. The method of claim 9, wherein forming the third solder bumps of the companion component comprises forming the third solder bumps larger than the second solder bumps of the companion component.

13. An electronic system, comprising:

a first substrate comprising first solder bumps on a bottom surface;

a processor integrated circuit (IC) die comprising at least one processor mounted on a top surface of the first substrate; and a memory on package (MOP) component comprising:

a second substrate;

one or more double data rate random access memory (DDR RAM) dies on a first surface of the second substrate;

second solder bumps contacting a second surface of the second substrate and the top surface of the first substrate;

a molded interconnect on the second surface of the second substrate, the molded interconnect comprising through mold vias (TMVs); and third solder bumps contacting the TMVs on a surface of the molded interconnect.

14. The electronic system of claim 13, comprising a mother board, wherein the first substrate is an electronics package substrate, and the first solder bumps of the first substrate and the third solder bumps of the MOP component contact the mother board.

15. The electronic system of claim 14, wherein the second solder bumps are configured to provide DDR signals to the electronics package substrate and the third solder bumps are configured to provide power from the mother board to the DDR RAM dies.

16. The electronic system of claim 13, wherein bonding pads for the first solder bumps and bonding pads for the third solder bumps of the MOP component have a same feature pitch size, and bonding pads for the second solder bumps of the MOP component have a smaller feature pitch size than the bonding pads for the third solder bumps of the MOP component.

17. An electronic system, comprising a first substrate comprising first solder bumps on a bottom surface, the first solder bumps having a first solder bump surface opposite from the bottom surface;

a processor integrated circuit (IC) die comprising at least one processor mounted on a top surface of the first substrate;

a companion component comprising:

a second substrate;

second solder bumps comprising a second solder bump surface; and third solder bumps comprising a third solder bump surface at a different height than the second solder bump surface, wherein the second solder bump surface contacts the top surface of the first substrate and the third solder bump surface is at a same height as the first solder bump surface; and an electronics package substrate, wherein the first substrate is a molded interconnect substrate, the first solder bump surface of the first substrate and the third solder bump surface of the companion component contact the electronics package substrate, and wherein the molded interconnect substrate comprises:

a first electrically conductive interconnect that provides electrical continuity between one or more of the second solder bumps of the companion component and the processor IC die; and one or more through mold vias (TMVs), wherein the electronics package substrate comprises a second electrically conductive interconnect that provides electrical continuity between one or more of the second solder bumps of the companion component and the one or more TMVs.

18. The electronic system of claim 17, wherein the companion component is a memory on package (MOP) component.

19. The electronic system of claim 18, wherein the MOP component comprises one or more double data rate random access memory (DDR RAM) dies.

20. The electronic system of claim 17, wherein a feature pitch size of bonding pads for the second solder bumps of the companion component is smaller than a feature pitch size of bonding pads for the third solder bumps of the companion component.

21. The electronic system of claim 20, wherein a feature pitch size of bonding pads for the first solder is the same as the feature pitch size of the bonding pads for the third solder bumps of the companion component.

* * * * *